United States Patent
Takasaki et al.

(10) Patent No.: US 9,438,140 B2
(45) Date of Patent: Sep. 6, 2016

(54) MEMBER FOR SEMICONDUCTOR MANUFACTURING APPARATUS

(71) Applicant: NGK INSULATORS, LTD., Nagoya (JP)

(72) Inventors: Hideaki Takasaki, Handa (JP); Takashi Kataigi, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 721 days.

(21) Appl. No.: 13/870,254

(22) Filed: Apr. 25, 2013

(65) Prior Publication Data

US 2013/0286533 A1   Oct. 31, 2013

Related U.S. Application Data

(60) Provisional application No. 61/639,215, filed on Apr. 27, 2012.

(51) Int. Cl.
| | |
|---|---|
| *H02N 13/00* | (2006.01) |
| *H01L 21/67* | (2006.01) |
| *H01L 21/683* | (2006.01) |
| *H01L 21/687* | (2006.01) |

(52) U.S. Cl.
CPC ........ *H02N 13/00* (2013.01); *H01L 21/67109* (2013.01); *H01L 21/6831* (2013.01); *H01L 21/68721* (2013.01); *H01L 21/68785* (2013.01)

(58) Field of Classification Search
CPC ............ H02N 13/00; H01L 21/67109; H01L 21/6831; H01L 21/68721; H01L 21/68785
See application file for complete search history.

(56) References Cited

U.S. PATENT DOCUMENTS

| | | | |
|---|---|---|---|
| 6,471,779 B1 | 10/2002 | Nishio et al. | |
| 6,669,783 B2 * | 12/2003 | Sexton | H01L 21/67103 118/725 |
| 2003/0150123 A1 * | 8/2003 | Fan | H01L 21/67259 33/542 |
| 2004/0226515 A1 * | 11/2004 | Yendler | C23C 16/4586 118/728 |
| 2006/0193101 A1 | 8/2006 | Sogabe et al. | |
| 2006/0279899 A1 | 12/2006 | Aihara et al. | |
| 2008/0011737 A1 | 1/2008 | Fukuoka et al. | |
| 2009/0014323 A1 * | 1/2009 | Yendler | H01J 37/20 204/298.33 |

FOREIGN PATENT DOCUMENTS

| | | |
|---|---|---|
| JP | 09-017849 A1 | 1/1997 |
| JP | 2000-315680 A1 | 11/2000 |
| JP | 2006-237348 A1 | 9/2006 |
| JP | 2006-344955 A1 | 12/2006 |
| JP | 2007-329008 A1 | 12/2007 |
| JP | 2011-222931 A1 | 11/2011 |
| WO | 2013/006407 A1 | 1/2013 |

OTHER PUBLICATIONS

Japanese Office Action (Application No. 2013-088545) dated Dec. 22, 2015.

* cited by examiner

*Primary Examiner* — Zeev V Kitov
(74) *Attorney, Agent, or Firm* — Burr & Brown, PLLC

(57) ABSTRACT

A member for a semiconductor manufacturing apparatus includes an electrostatic chuck, a cooling unit, a spacer (an O-ring, an outer periphery spacer, or the like) for securing a gap placed between the electrostatic chuck and the cooling unit, and a clamp ring placed on the upper surface of the outer periphery of the electrostatic chuck. The clamp ring is fastened to the cooling unit with screws. The screws are inserted into coil springs that prevent loosening, and are fastened to nuts. The coil springs are attached not to the clamp ring side but to the cooling unit side.

8 Claims, 4 Drawing Sheets

(a)

(b)

(a)

(b)

MEMBER FOR SEMICONDUCTOR MANUFACTURING APPARATUS

BACKGROUND OF THE INVENTION

1. Field of the Invention

The present invention relates to a member for a semiconductor manufacturing apparatus.

2. Description of the Related Art

Hitherto, there has been known a member for a semiconductor manufacturing apparatus in which an electrostatic chuck having a wafer placing surface is provided on a cooling unit. Such a member for a semiconductor manufacturing apparatus in which for the purpose of taking heat from a wafer placed on the electrostatic chuck, back side gas such as helium (He) is caused to flow to the back side of the wafer has been known (see, for example, PTL 1).

CITATION LIST

Patent Literature

[PTL 1] Japanese Unexamined Patent Application Publication No. 2000-315680

SUMMARY OF THE INVENTION

It is conceivable that in such a member for a semiconductor manufacturing apparatus, a spacer for securing a gap is placed between the electrostatic chuck and the cooling unit, and the electrostatic chuck and the cooling unit are fixed to each other by fastening a clamp ring placed on the upper surface of the outer periphery of the electrostatic chuck to the cooling unit with screws (double gap type). When fastening with screws, a worker inserts the screw foot into a spring washer, then inserts the screw foot from the clamp ring side, passes the screw foot through the clamp ring, and screws the screw foot into a screw hole provided in the cooling unit. The spring washer prevents the screw from coming loose.

However, in this member for a semiconductor manufacturing apparatus, the thermal uniformity sometimes shifts with repeated use. The thermal uniformity is one of indicators for evaluation of a member for a semiconductor manufacturing apparatus, and is the difference between the highest temperature and the lowest temperature when the temperatures of a plurality of places of the wafer are measured. A shift in the thermal uniformity is unfavorable because it makes it difficult to uniformly process a wafer.

The present invention solves such a problem, and it is the main object of the present invention to provide a member for a semiconductor manufacturing apparatus the thermal uniformity of which hardly shifts with repeated use.

A member for a semiconductor manufacturing apparatus of the present invention includes an electrostatic chuck, a cooling unit, a spacer for securing a gap placed between the electrostatic chuck and the cooling unit, and a clamp ring placed on the upper surface of the outer periphery of the electrostatic chuck. The electrostatic chuck and the cooling unit are fixed to each other by fastening the clamp ring to the cooling unit with screws. The screws are inserted into spring members that prevent loosening, and are tightened. The spring members are attached not to the clamp ring side but to the cooling unit side.

In the member for a semiconductor manufacturing apparatus of the present invention, the spring members are placed on the cooling unit side, and therefore permanent set due to heat is less likely to occur compared to a case where the spring members are placed on the clamp ring side. If permanent set due to heat of the spring members occurs, the tightening torque decreases compared to the initial state, the pressure that presses the electrostatic chuck and the cooling unit changes, the amount of heat transferred through the spacer also changes accordingly, and the thermal uniformity is affected. In the present invention, such permanent set due to heat of the spring members is less likely to occur. Therefore, even if it is repeatedly used, the thermal uniformity hardly shifts.

In the member for a semiconductor manufacturing apparatus of the present invention, the spring members are preferably coil springs. In this case, compared to a case where the spring members are spring washers, the thermal uniformity in the initial state is favorable. In the case of spring washers, the pressure that presses the electrostatic chuck and the cooling unit does not easily become constant even if tightening is performed with a predetermined tightening torque. In contrast, in the case of coil springs, such pressure easily becomes constant, and the thermal uniformity in the initial state is favorable.

In the member for a semiconductor manufacturing apparatus of the present invention, the screw feet of the screws may pass through the clamp ring and the cooling unit from the clamp ring side, and after the screw feet pass through the cooling unit, nuts may be screwed on the screw feet, with the spring members therebetween. In this case, a structure in which the spring members are placed on the cooling unit side can be easily constructed.

In the member for a semiconductor manufacturing apparatus of the present invention, heat-transfer gas may be supplied to the gap. In this case, heat exchange between the electrostatic chuck and the cooling unit is performed through the heat-transfer gas, and therefore the thermal uniformity improves further.

In the member for a semiconductor manufacturing apparatus of the present invention, a dot-like outer periphery spacer may be placed at a position where a gap outer peripheral part of the gap along the outer periphery of the electrostatic chuck intersects with a radial direction from the center of the electrostatic chuck toward the screw. In this case, when the clamp ring is fastened with screws, the electrostatic chuck is not pressed like a cantilever, and therefore the electrostatic chuck can be prevented from being damaged. In this case, the dot-like outer periphery spacer is preferably integrated with a spacer support that is formed in a ring-like shape so as to protrude outwardly from the gap. When the outer periphery spacer is dot-like, the outer periphery spacer is sometimes displaced. However, here the dot-like outer periphery spacer is integrated with the ring-like spacer support, and is therefore not displaced. In addition, since the spacer support is protruding outwardly from the gap, the spacer support hardly promotes the heat transfer between the electrostatic chuck and the cooling unit. Therefore, the outer periphery spacer hardly affects the thermal uniformity.

In the member for a semiconductor manufacturing apparatus of the present invention, a ring-like outer periphery spacer may be placed in a gap outer peripheral part of the gap along the outer periphery of the electrostatic chuck. Also in this case, when the clamp ring is fastened with screws, the electrostatic chuck is not pressed like a cantilever, and therefore the electrostatic chuck can be prevented from being damaged. When the outer periphery spacer is dot-like, the outer periphery spacer is sometimes displaced. However, here the outer periphery spacer is ring-like, and is therefore not displaced.

In the member for a semiconductor manufacturing apparatus of the present invention, when it has the outer periphery spacer, the outer periphery spacer is preferably made of polyimide resin. The outer periphery spacer may be made of fluororesin such as polytetrafluoroethylene. Since polyimide resin is harder, the outer periphery spacer is less deformable, and the screws are less likely to come loose. As a result, the thermal uniformity is less likely to shift.

DETAILED DESCRIPTION OF THE INVENTION

Figure 1:
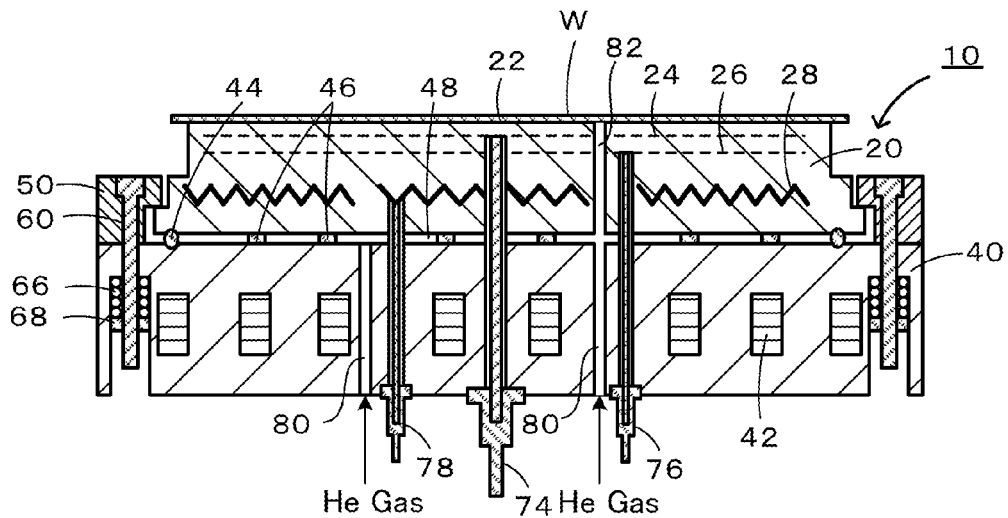
FIG. 1 is a longitudinal sectional view of a member for a semiconductor manufacturing apparatus.
Figure 2:
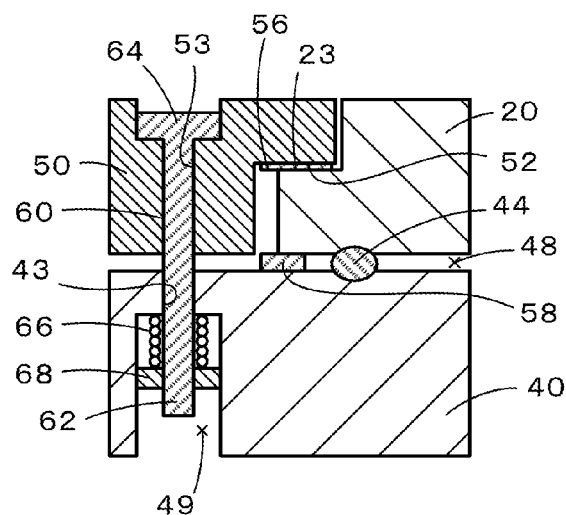
FIG. 2 is an enlarged view of a clamp ring and its vicinity.

Next, a preferred embodiment of the present invention will now be described with reference to the drawings. FIG. 1 is a longitudinal sectional view of a member 10 for a semiconductor manufacturing apparatus, and FIG. 2 is an enlarged view of a clamp ring and its vicinity.

The member 10 for a semiconductor manufacturing apparatus includes an electrostatic chuck 20 and a cooling unit 40 that are fixed to each other by fastening a clamp ring 50 placed on the upper surface of the outer periphery of the electrostatic chuck 20 to the cooling unit 40 with screws 60.

The electrostatic chuck 20 is a disk-shaped member made of ceramics such as alumina, and has a wafer placing surface 22. A plurality of embossed portions (small protrusions) (not shown) are provided on the wafer placing surface 22, and a wafer W to be subjected to plasma treatment is placed on the embossed portions. The electrostatic chuck 20 has therein an electrostatic electrode 24, an RF electrode 26, and a resistance heating element (heater) 28.

The cooling unit 40 is a disk-shaped member made of metal such as aluminum, and has therein a refrigerant passage 42 in which refrigerant can be circulated. Between the cooling unit 40 and the electrostatic chuck 20, an O-ring 44 having a shape conforming to the outer periphery of the electrostatic chuck 20, and a plurality of dot members 46 placed inside the O-ring 44 are placed, and a gap 48 is thereby formed. The O-ring 44 is made, for example, of fluoro-rubber or silicone rubber. The dot members are made, for example, of polytetrafluoroethylene or polyimide.

The clamp ring 50 is located on the upper surface of the outer periphery of the cooling unit 40. As shown in FIG. 2, a stepped portion 52 is provided on the inner peripheral surface of the clamp ring 50. The stepped portion 52 is placed so as to press, from above, a stepped portion 23 provided on the outer wall of the electrostatic chuck 20, with an insulating ring sheet 56 therebetween. The clamp ring 50 has vertical holes 53 into which the screws 60 can be inserted. The cooling unit 40 also has vertical holes 43 into which the screws 60 can be inserted. The vertical holes 43 communicate with recessed portions 49 provided in the lower surface of the cooling unit 40. The screw feet 62 of the screws 60 pass through the vertical holes 53 of the clamp ring 50 and the vertical holes 43 of the cooling unit 40 from the clamp ring side. After the screw feet 62 reach the recessed portions 49 of the cooling unit 40, nuts 68 are screwed on the screw feet 62, with coil springs 66 therebetween. This screwing work is performed until a predetermined tightening torque is reached. The screws 60 are provided at a plurality of places (for example, three or four places) along the circumferential direction of the clamp ring 50. An outer periphery spacer 58 is placed between the electrostatic chuck 20 and the cooling unit 40 and outside the O-ring 44. The outer periphery spacer 58 is ring-shaped or dot-shaped. The ring sheet 56 and the outer periphery spacer 58 are made, for example, of polytetrafluoroethylene or non-stick polyimide laminate material.

As shown in FIG. 1, the member 10 for a semiconductor manufacturing apparatus has a feeding terminal 74 that supplies power from the lower surface side of the cooling unit 40 to the electrostatic electrode 24 in the electrostatic chuck 20, a feeding terminal 76 that supplies RF voltage from the lower surface side of the cooling unit 40 to the RF electrode 26 in the electrostatic chuck 20, a feeding terminal 78 that supplies power from the lower surface side of the cooling unit 40 to the resistance heating element 28 in the electrostatic chuck 20, and gas supply holes 80 and 82 that supply helium gas (heat-transfer gas) from the lower surface side of the cooling unit 40 to the gap 48 and the space on the back side of the wafer W.

Such a member 10 for a semiconductor manufacturing apparatus is installed in a chamber (not shown). A wafer W is placed on the wafer placing surface 22, and a voltage for attracting the wafer W is applied to the electrostatic electrode 24. In addition, in order to heat the wafer W, a voltage is applied to the resistance heating element 28. Further, raw material gas is introduced into the chamber, an RF voltage for generating plasma is applied to the RF electrode 26, plasma is thereby generated, and the processing of the wafer W is performed. At this time, back side gas such as helium is introduced into the gas supply holes 80 and 82 from a gas cylinder (not shown).

According to the member 10 for a semiconductor manufacturing apparatus of this embodiment, even if it is repeatedly used, the thermal uniformity hardly shifts. The reason is that since the coil springs 66 are placed on the cooling unit side, permanent set due to heat is less likely to occur compared to a case where the coil springs 66 are placed on the clamp ring side. If permanent set due to heat of the coil springs 66 occurs, the tightening torque decreases compared to the initial state, and the pressure that presses the electrostatic chuck 20 and the cooling unit 40 changes. If the pressing pressure changes, the amount of heat transferred through the O-ring 44 and the dot members 46 also changes accordingly, and the thermal uniformity is affected.

In addition, since the coil springs 66 are used, the thermal uniformity in the initial state is favorable compared to a case where spring washers are used. When spring washers are used, the pressure that presses the electrostatic chuck 20 and the cooling unit 40 does not easily become constant even if tightening is performed with a predetermined tightening torque. In contrast, when coil springs are used, such pressure easily becomes constant.

It goes without saying that the present invention is not limited to the above-described embodiment, and can be embodied in various ways without departing from the technical scope of the present invention.

EXAMPLES

Example 1, Comparative Example 1

Figure 3:
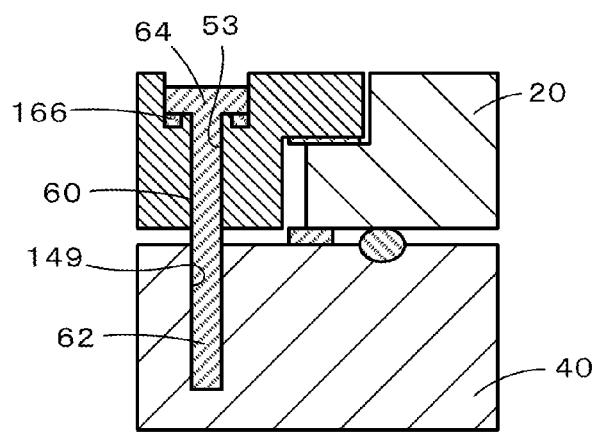
FIG. 3 is an enlarged view of a clamp ring and its vicinity of Comparative Example 1.

The above-described member 10 for a semiconductor manufacturing apparatus was made as Example 1. A member for a semiconductor manufacturing apparatus that was the same as the member 10 for a semiconductor manufacturing apparatus except that the structure around the clamp ring was changed as shown in FIG. 3 was made as Comparative Example 1. In FIG. 3, instead of recessed portions 49, screw holes 149 were provided in the cooling unit 40. In the member for a semiconductor manufacturing apparatus of FIG. 3, the electrostatic chuck 20 and the cooling unit 40 were fixed to each other according to the following procedure. First, the screw foot 62 of the screw 60 was inserted into a spring washer 166. Next, the screw foot 62 was inserted into the vertical hole 53 of the clamp ring 50, and the screw foot 62 was screwed into the screw hole 149 until a predetermined tightening torque is reached. At this time, the spring washer 166 was compressed by the screw head 64 and the clamp ring 50. In both Example 1 and Comparative Example 1, when the clamp ring 50 was fastened with screws 60, the electrostatic chuck 20 was not damaged in the stepped portion 23.

With respect to Example 1 and Comparative Example 1, the thermal uniformity in the initial state and the variation in input power were measured. Immediately after the member 10 for a semiconductor manufacturing apparatus was assembled, power was supplied such that the temperature of the wafer placing surface 22 became 250° C. The thermal uniformity in the initial state was defined as the difference between the highest temperature and the lowest temperature of the wafer placing surface 22 thirty minutes after the start of power supply. With respect to Example 1, three identical samples were made (n=3). With respect to Comparative Example 1, four identical samples were made (n=4). With respect to each of them, measurement was performed. With respect to the three samples of Example 1 and the four samples of Comparative Example 1, the amount of power thirty minutes after the start of power supply was measured. The variation in input power was defined as standard deviation of the measurements. The results are shown in Table 1. The measurement of thermal uniformity was performed by photographing each sample with an infrared camera.

TABLE 1

| | | Example 1 | Comparative Example 1 |
|---|---|---|---|
| In the Initial State | Thermal Uniformity (° C.) | Ave. 10.8 (σ: 3.1, n = 3) | Ave. 17.4 (σ: 5.6, n = 4) |
| | Variation in Input Power (W) | σ: 94 (n = 3) | σ: 266 (n = 4) |
| After the Power Supply | Amount of Shift in Thermal Uniformity (° C.) | 0.1 (n = 1) | 2.1 (n = 1) |

A thermal cycle from 100° C. to 250° C. was applied to each of one of the samples of Example 1 and one of the samples of Comparative Example 1, the thermal uniformity was measured again, and the difference between the thermal uniformity at that time and the thermal uniformity in the initial state was referred to as the amount of shift in thermal uniformity. The number of cycles was 15 in Example 1, and 14 in Comparative Example 1. The results are shown in Table 1.

As is clear from Table 1, the thermal uniformity in the initial state of Example 1 was favorable compared to Comparative Example 1. The reason is that spring washers were used in Comparative Example 1, and coil springs were used in Example 1 as spring members that prevent the occurrence of loosening of fastening. When spring washers are used, the pressure that presses the electrostatic chuck and the cooling unit does not easily become constant even if tightening is performed with a predetermined tightening torque. In contrast, when coil springs are used, such pressure easily becomes constant. If the pressing pressure changes, the amount of heat transferred through the spacers (the O-ring and the dot members) also changes accordingly, and the thermal uniformity is affected. As a result, the thermal uniformity of Comparative Example 1 was worse than that of Example 1.

The amount of shift in thermal uniformity of Example 1 was also favorable compared to Comparative Example 1. The reason is that since, in Example 1, the spring members (coil springs) were placed on the cooling unit side, permanent set due to heat was less likely to occur compared to Comparative Example 1 in which the spring members (spring washers) were placed on the clamp ring side. If permanent set due to heat of the spring members occurs, the tightening torque decreases compared to the initial state, and the pressure that presses the electrostatic chuck and the cooling unit changes. If the pressing pressure changes, the amount of heat transferred through the spacers (the O-ring and the dot members) also changes accordingly, and the thermal uniformity is affected. As a result, the amount of shift in thermal uniformity of Comparative Example 1 was larger than that of Example 1.

Example 2

Figure 4:
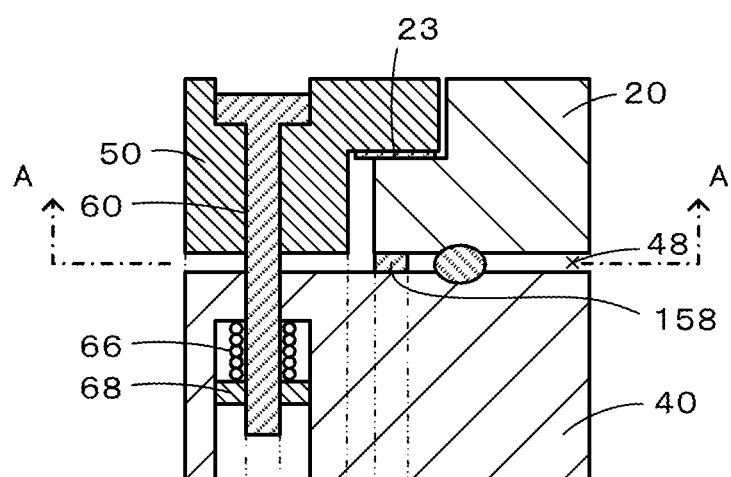
FIG. 4 is an enlarged view of a clamp ring and its vicinity of Example 2.
Figure 4:
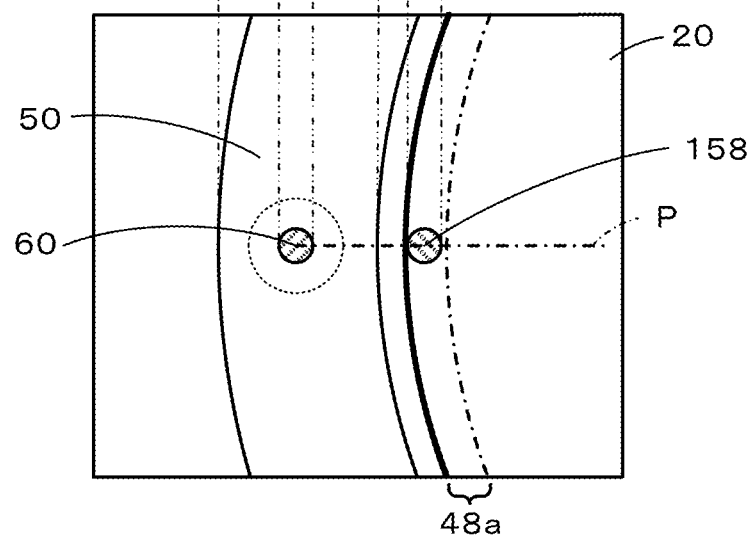

FIG. 4 is an explanatory diagram of Example 2, (a) is an enlarged longitudinal sectional view of the clamp ring and its vicinity, and (b) is a sectional view taken along line A-A of (a). In FIG. 4 (b), the outer peripheral edge of the electrostatic chuck 20 is shown by a heavy line. In Example 2, instead of the outer periphery spacer 58 of Example 1, a dot-like outer periphery spacer 158 made of polytetrafluoroethylene was used. This outer periphery spacer 158 is placed in a gap outer peripheral part 48a of the gap 48 along the outer periphery of the electrostatic chuck 20. Specifically, the outer periphery spacer 158 is placed at a position where the gap outer peripheral part 48a intersects with a radial direction P from the center of the electrostatic chuck 20 toward the screw 60. In Example 2, when the clamp ring 50 was fastened using screws 60, coil springs 66, and nuts 68, the electrostatic chuck 20 was not damaged in the stepped portion 23. Although the outer periphery spacer 158 was dot-like, the material thereof is slightly soft. When screws were tightened, the outer periphery spacer 158 was slightly deformed and was therefore not displaced. In addition, since the outer periphery spacer 158 was dot-like, no cool spot was generated in the outer peripheral part of the electrostatic chuck 20. However, since the material of the outer periphery spacer 158 was slightly soft, the outer periphery spacer 158 was deformed over time, and the screws 60 loosened slightly, and the thermal uniformity tended to shift slightly.

Example 3

A member for a semiconductor manufacturing apparatus that was the same as Example 2 (FIG. 4) except that the material of the outer periphery spacer 158 was changed to polyimide was made. In Example 3, when the clamp ring 50 was fastened using screws 60, coil springs 66, and nuts 68, the electrostatic chuck 20 was not damaged in the stepped portion 23. In addition, since the outer periphery spacer 158 was dot-like, no cool spot was generated in the outer peripheral part of the electrostatic chuck 20. Further, since the material of the outer periphery spacer 158 was hard, the outer periphery spacer 158 was not deformed over time, and the thermal uniformity did not shift owing to the loose of the screws 60. However, since the material of the outer periphery spacer 158 was hard and the outer periphery spacer 158 was less deformable when screws were tightened, the outer periphery spacer 158 was sometimes displaced.

Example 4

Figure 5:
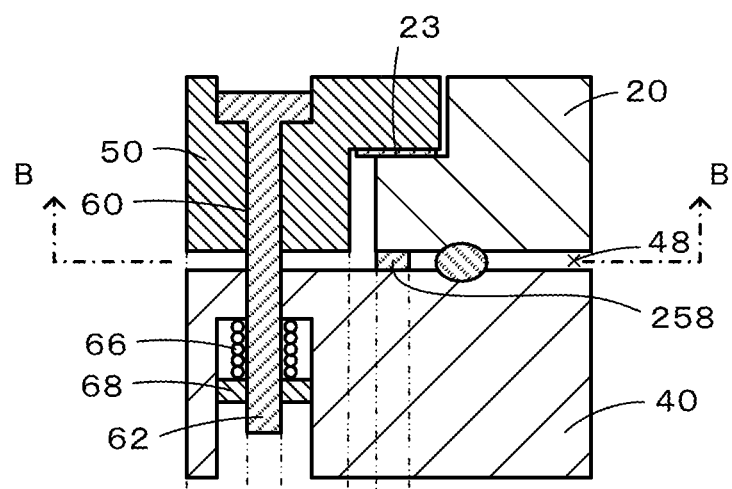
FIG. 5 is an enlarged view of a clamp ring and its vicinity of Example 4.
Figure 5:
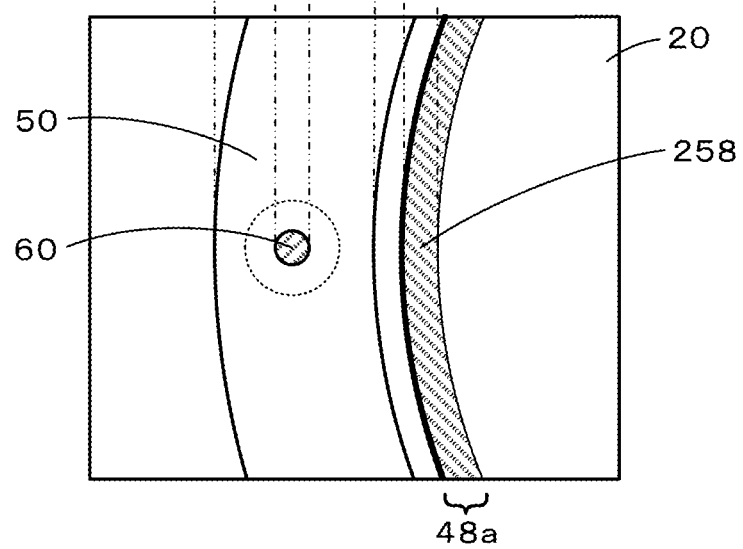

FIG. 5 is an explanatory diagram of Example 4, (a) is an enlarged longitudinal sectional view of the clamp ring and its vicinity, and (b) is a sectional view taken along line B-B of (a). In FIG. 5 (b), the outer peripheral edge of the electrostatic chuck 20 is shown by a heavy line. In Example 4, instead of the outer periphery spacer 58 of Example 1, a ring-like outer periphery spacer 258 made of polyimide was used. This outer periphery spacer 258 is placed in a gap outer peripheral part 48a of the gap 48 along the outer periphery of the electrostatic chuck 20. In Example 4, when the clamp ring 50 was fastened using screws 60, coil springs 66, and nuts 68, the electrostatic chuck 20 was not damaged in the stepped portion 23. In addition, since the material of the outer periphery spacer 258 was hard, the outer periphery spacer 258 was not deformed over time, and the thermal uniformity did not shift owing to the loose of the screws 60. Further, since the outer periphery spacer 258 was ring-like, it was not displaced. However, since the contact area between the outer periphery spacer 258 and the outer peripheral part of the electrostatic chuck 20 increased, a slight cool spot tended to be generated.

Example 5

Figure 6:
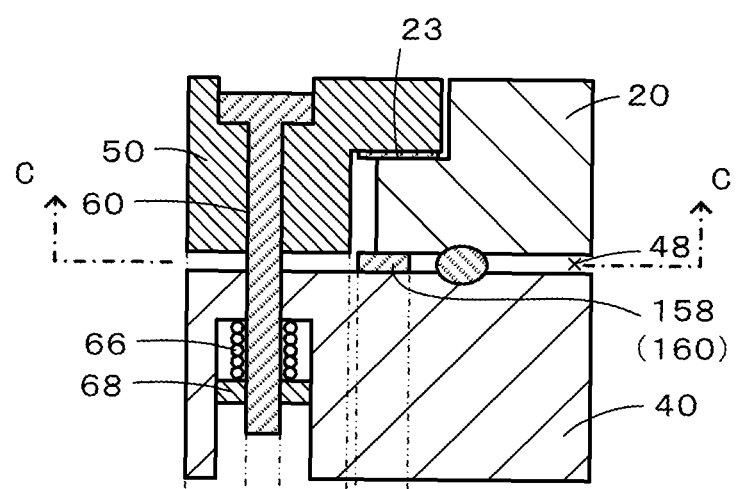
FIG. 6 is an enlarged view of a clamp ring and its vicinity of Example 5.
Figure 6:
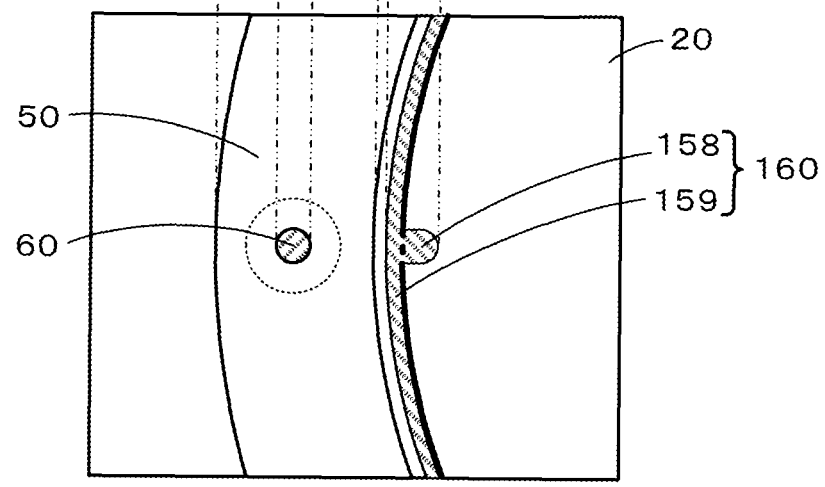

FIG. 6 is an explanatory diagram of Example 5, (a) is an enlarged longitudinal sectional view of the clamp ring and its vicinity, and (b) is a sectional view taken along line C-C of (a). In FIG. 6 (b), the outer peripheral edge of the electrostatic chuck 20 is shown by a heavy line. In Example 5, the dot-like outer periphery spacer 158 made of polyimide of Example 3 was integrated with a spacer support 159 that was formed in a ring-like shape so as to protrude outwardly from the gap 48, and an internally-toothed ring 160 was thereby formed. In Example 5, when the clamp ring 50 was fastened using screws 60, coil springs 66, and nuts 68, the electrostatic chuck 20 was not damaged in the stepped portion 23. In addition, since the material of the outer periphery spacer 158 was hard, the outer periphery spacer 158 was not deformed over time, and the thermal uniformity did not shift owing to the loose of the screws 60. Further, since the dot-like outer periphery spacer 158 was integrated with the ring-like spacer support 159, the outer periphery spacer 158 was not displaced. Moreover, since the contact area between the outer periphery spacer 158 and the outer peripheral part of the electrostatic chuck 20 was equal to those of Examples 2 and 3, no cool spot was generated. Example 5 is the best mode among Examples 1 to 5.

The present application claims priority from U.S. Provisional Application No. 61/639,215 filed on Apr. 27, 2012, the entire contents of which are incorporated herein by reference.

INDUSTRIAL APPLICABILITY

The present invention can be used in an semiconductor manufacturing apparatus, and can be used, for example, as a susceptor, an electrostatic chuck, a ceramic heater, or the like supporting a wafer.

What is claimed is:

1. A member for a semiconductor manufacturing apparatus, including:
an electrostatic chuck, a cooling unit, a spacer for securing a gap placed between the electrostatic chuck and the cooling unit, and an insulating spacer interposed between a clamp ring and an upper surface of the outer periphery of the electrostatic chuck, the electrostatic chuck and the cooling unit are fixed to each other by fastening the clamp ring to the cooling unit with screws,
wherein the screws are inserted into coil springs that prevent loosening, and are tightened such that a space having a vertical clearance and no direct contact between the clamp ring and the cooling unit is formed, and,
the coil springs are attached not to the clamp ring side but to the cooling unit side.

2. The member for a semiconductor manufacturing apparatus according to claim 1, wherein the screw feet of the screws pass through the clamp ring and the cooling unit from the clamp ring side, and after the screw feet pass through the cooling unit, nuts are screwed on the screw feet, with the coil springs therebetween.

3. The member for a semiconductor manufacturing apparatus according claim 1, wherein heat-transfer gas is supplied to the gap.

4. The member for a semiconductor manufacturing apparatus according to claim 1, wherein a dot-like outer periphery spacer is placed at a position where a gap outer peripheral part of the gap along the outer periphery of the electrostatic chuck intersects with a radial direction from the center of the electrostatic chuck toward the screw.

5. The member for a semiconductor manufacturing apparatus according to claim 4, wherein the dot-like outer periphery spacer is integrated with a spacer support that is formed in a ring-like shape so as to protrude outwardly from the gap.

6. The member for a semiconductor manufacturing apparatus according to claim 1, wherein a ring-like outer periphery spacer is placed in a gap outer peripheral part of the gap along the outer periphery of the electrostatic chuck.

7. The member for a semiconductor manufacturing apparatus according claim 6, wherein the outer periphery spacer is made of polyimide resin.

8. The member for a semiconductor manufacturing apparatus according claim 4, wherein the outer periphery spacer is made of polyimide resin.

* * * * *